(12) United States Patent
Otsuki

(10) Patent No.: US 6,218,888 B1
(45) Date of Patent: *Apr. 17, 2001

(54) INSULATED GATE BIPOLAR TRANSISTOR DEVICE WITH A CURRENT LIMITING CIRCUIT

(75) Inventor: Masahito Otsuki, Nagano (JP)

(73) Assignee: Fuji Electric Co., Ltd., Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/816,832

(22) Filed: Mar. 18, 1997

(30) Foreign Application Priority Data

Mar. 18, 1996 (JP) .................................................. 8-060499

(51) Int. Cl.[7] .................................................. H03K 17/56
(52) U.S. Cl. .......................... 327/419; 327/427; 327/482
(58) Field of Search .................................. 326/85, 87, 91; 327/108, 109, 110, 111, 112, 327, 328, 365, 379, 380, 381, 387, 389, 403, 404, 405, 419, 427, 434, 478, 482, 489, 520, 577, 590; 361/54, 57, 93

(56) References Cited

U.S. PATENT DOCUMENTS

| | | | |
|---|---|---|---|
| 4,532,443 | * 7/1985 | Glennon | 307/575 |
| 5,272,392 | * 12/1993 | Wong et al. | 307/270 |
| 5,396,117 | * 3/1995 | Housen et al. | 327/480 |
| 5,408,141 | * 4/1995 | Devore et al. | 327/541 |
| 5,432,471 | * 7/1995 | Majumdar et al. | 327/380 |
| 5,473,276 | * 12/1995 | Throngnumchai | 327/432 |
| 5,500,619 | * 3/1996 | Miyasaka | 327/427 |
| 5,734,277 | * 3/1998 | Hu et al. | 327/108 |
| 5,774,000 | * 6/1998 | Vercellotti et al. | 327/110 |
| 5,801,572 | * 9/1998 | Nakamura | 327/434 |
| 5,854,560 | * 12/1998 | Chow | 326/27 |
| 5,894,139 | * 4/1999 | Otsuki et al. | 257/139 |

FOREIGN PATENT DOCUMENTS 8-250707  9/1996  (JP) .

* cited by examiner

Primary Examiner—Jeffrey Zweizig
(74) Attorney, Agent, or Firm—Finnegan, Henderson, Farabow, Garrett & Dunner, L.L.P.

(57) ABSTRACT

An insulated gate bipolar transistor (IGBT) device is a semiconductor device comprising a main IGBT 1, a sub IGBT 20, and a current limiting circuit 30 on one chip. It has an n-channel main IGBT 1, sub IGBT 20, and sensor IGBT 2 connected in parallel, whose current is controlled by a gate signal IN, an emitter resistor RE of the sensor IGBT 2, and an n-channel MOSFET 7 to which a voltage drop of the emitter resistor RE is applied as a gate voltage for fast discharging gate capacities C1, C2, and C20 of the IGBT 1, IGBT 2, and IGBT 20. Threshold voltage VTHB of the sub IGBT 20 is set high on the order of 1 V as compared with threshold voltage VTHA of the main IGBT 1 and the sensor IGBT 2. When a load 6 is discharged, the gate capacities C1, C2, and C20 are discharged dominantly, thus only the sub IGBT 20 is cut off and the main IGBT 1 and the sensor IGBT 2 perform the current limit operation, so that the load short-circuiting current can be stepped down drastically.

3 Claims, 5 Drawing Sheets

INSULATED GATE BIPOLAR TRANSISTOR DEVICE WITH A CURRENT LIMITING CIRCUIT

BACKGROUND OF THE INVENTION

1. Field of the Invention

This invention relates to a semiconductor device of one chip containing insulated gate bipolar transistors (IGBTs) and a current limiting circuit for limiting an overcurrent at the load short-circuiting time, etc.

2. Description of the Related Art

For example, as shown in FIG. 6, a semiconductor device comprising a main IGBT 1 and a current limiting circuit 10 on one chip is known as a switching device of a large current and a low saturation voltage (low on voltage). It has an n-channel main IGBT 1, an n-channel sensor IGBT 2 connected in parallel with the main IGBT 1, an emitter resistor RE of the sensor IGBT 2, and an n-channel MOSFET 3 for performing feedback control of a value of gate voltage VG of IGBT when voltage of the emitter resistor RE drops. A gate input signal IN is input to gates G of the main IGBT 1 and the sensor IGBT 2 via an external gate resistor RG connected to a gate terminal A, and VCC power supply is connected to a collector terminal C via a load 6.

By the way, as shown in FIG. 7, the semiconductor structure of the IGBT 1, IGBT 2 has a $p^+$-type collector layer (minority carrier injection layer) 12 covered with a collector electrode 11 on the rear face, an $n^+$-type buffer layer 13 laminated on the collector layer 12, an $n^-$-type conductivity modulation layer (n base layer) 14 formed on the buffer layer 13 by epitaxial growth, a polysilicon gate electrode 16 formed on the surface of the conductivity modulation layer 14 via a gate insulating film 15, p-type base layers 17 formed like wells on the surface of the conductivity modulation layer 14 by a self-alignment technique with the gate electrode 16 as a mask, and $n^{3o}$-type source layers 19 introduced and formed using aluminum emitter electrodes 18 formed on the base layers 17. In such an IGBT of the semiconductor structure, when a positive potential for the emitter electrode 18 is applied to the gate electrode 16, a channel is formed as an inversion layer on the surface of the p-type base layer 17 as a channel diffusion layer just below the gate electrode 16 and electrons are injected into the conductivity modulation layer 14 via the channel from the emitter electrode 18. In response to this phenomenon, holes are injected into the conductivity modulation layer 14 from the collector layer 12. Thus, the electric conductivity of the conductivity modulation layer 14 abruptly rises, turning on, resulting in a low on voltage.

When the main IGBT 1 is on in the semiconductor device in FIG. 6, if the load 6 is short-circuited, collector current abruptly increases not only in the main IGBT 1, but also in the sensor IGBT 2 parallel with the main IGBT 1. Thus, voltage drop of the emitter resistor RE abruptly rises and the saturation drain current of the MOSFET 3 for gate voltage control increases, discharging gate capacities C1 and C2 of the IGBT 2, thus the gate voltages of the main IGBT 1 and the sensor IGBT 2 abruptly drop. Resultantly, the collector current of the main IGBT 1 and the sensor IGBT 2 abruptly decreases. The reason why the collector current value is limited and a proper amount of current is continued without cutting off the main IGBT 1 when the load is short-circuited is that it is necessary to continue the limit current value without immediately cutting off the main current of the main IGBT 1 in the semiconductor device (chip) until an external protection circuit (not shown) starts operation in response to the short-circuiting of the load.

However, when the load of the IGBT comprising the current limiting circuit 10 is short-circuited, the discharge action of the MOSFET 3 is made dominant and the gate voltage VG is lowered to a predetermined value under the charge action according to the high level voltage of the gate input signal IN of the gate capacity C1, C2 for performing analog current limiting of the IGBT 1, IGBT 2. Thus, the limit current value at the load short-circuiting time varies from one chip to another and the destruction resistance amount to the load short-circuiting largely varies because of resistance value variations of the emitter resistor RE, characteristic variations of the gate voltage control MOSFET 3, temperature characteristic, etc., caused by the current limit action.

To suppress such variations in destruction resistance amounts to the load short-circuiting, a structure for increasing the latch-up resistance amount at the load short-circuiting time, etc., of IGBT rather than building active elements of a feedback loop in one chip is known.

In the IGBT structure shown in FIG. 8A, an emitter electrode 18 is not in direct contact with stripe-like source layers 19 extending in the gate width (channel width) direction of gate electrodes 16 and comes in conductive contact with branch parts 19a extending lice comb teeth from the source layers 19, and diffusion resistance rS is parasitic on each branch part 19a. In such a semiconductor structure in which diffusion resistance rS lies equivalently between the source layers 19 and the emitter electrode 18, if hole current IH flowing into the emitter electrode 18 via just below the source layers 19 in a base layer 17 at the load short-circuiting time abruptly increases and voltage drop of diffusion resistance rB increases, electron current IE flowing through the source layers 19 also abruptly increases at the same time and voltage drop of diffusion resistance rS also increases. Thus, the pn junction of the base layer 17 and the source layer 19 is hard to be forward-biased and parasitic transistor (npn-type transistor consisting of a conductivity modulation layer 14, the base layer 17, and the source layer 19) is hard to latch up. Thus, the destruction resistance amount to load short-circuiting raises.

On the other hand, the IGBT structure shown in FIG. 8B is a structure wherein island-like source layers 19b are formed discretely in the gate width (channel width) direction of gate electrodes 16 and an emitter electrode 18 is formed so as to extend over the source layers 19b; this structure is called a partial channel form structure. In this partial channel form structure, only the hollow portions between the source layers 19b with respect to channels just below the gate electrodes 16 do not conduct with the emitter electrode 18. Resultantly, as in the structure in FIG. 8A, diffusion resistance rS is parasitic between the source layers 19b and the emitter electrode 18, thereby improving the destruction resistance amount to load short-circuiting.

However, even the IGBT structures shown in FIGS. 8A and 8B involve the following problems:

(1) In the overcurrent period such as the load short-circuiting time, the structures are effective for increasing the latch-up resistance amount by an abrupt increase in voltage drop caused by diffusion resistance rS of the source layers 19. However, electron current also flows into diffusion resistance rS in the normal on state and the voltage drop continues. Thus, as a matter of course, on voltage (saturation collector voltage) VCE (sat) raises, increasing an on loss.

(2) Since an abnormal overcurrent of an unknown value may flow at the load short-circuiting time, improvement in the latch-up resistance amount is limited and element destruction may be unable to be prevented.

SUMMARY OF THE INVENTION

The invention has been made in view of the above circumstances, and therefore a first object of the invention is to provide an insulated gate bipolar transistor device capable of suppressing variations in destruction resistance amounts to load short-circuiting although it comprises the current limiting circuit for limiting current in the overcurrent period such as the load short-circuiting time.

A second object of the invention is to provide an insulated gate bipolar transistor device comprising a current limiting circuit operating at low on voltage in the normal state.

To accomplish the first object, according to the invention, there is provided means for performing analog current limiting and also discrete stepping down of current value when load short-circuiting is detected. That is, a first insulated gate bipolar transistor device comprising a current limiting circuit of the invention has a first IGBT of a first conduction type whose current is controlled by a gate voltage of a gate terminal, a sensor IGBT of the first conduction type whose current is controlled by the gate voltage, the sensor IGBT being connected in parallel with the first IGBT, a second IGBT of the first conduction type whose current is controlled by the gate voltage, the second IGBT being connected in parallel with the first IGBT, current-voltage conversion means for converting an increase or decrease in a collector current of the sensor IGBT into an increase or decrease in voltage, and active means whose current is controlled based on the conversion voltage for charging or discharging a gate capacity attendant on the gate terminal as a monolithic chip, characterized in that threshold voltage $V_{TH2}$ of the second IGBT is set high on the order of 1 V as compared with threshold voltage $V_{TH1}$ of the first IGBT.

A second insulated gate bipolar transistor device comprising a current limiting circuit of the invention has a first IGBT of a first conduction type whose current is controlled by a gate voltage of a gate terminal, a sensor IGBT of the first conduction type whose current is controlled by the gate voltage, the sensor IGBT being connected in parallel with the first IGBT, a second IGBT of the first conduction type having a gate connected via a gate resistor to the gate terminal, the second IGBT being connected in parallel with the first IGBT, current-voltage conversion means for converting an increase or decrease in a collector current of the sensor IGBT into an increase or decrease in voltage, and active means whose current is controlled based on the conversion voltage for charging or discharging a gate capacity attendant on the gate as a monolithic chip. Preferably, the threshold voltage $V_{TH2}$ of the second IGBT is set low on the order of 1 V as compared with the threshold voltage $V_{TH1}$ of the first IGBT.

In the first means, when the first IGBT, the second IGBT, and the sensor IGBT are on, if the load is short-circuited, a large collector current also flows into the sensor IGBT, causing the conversion voltage of the current-voltage conversion means to abruptly change and the current flowing into the active means abruptly increase. Thus, the gate capacities of the first IGBT, the second IGBT, and the sensor IGBT are discharged (or charged) dominantly, so that the gate voltage falls below the threshold voltage $V_{TH2}$. Resultantly, only the second IGBT opens and the overcurrent caused by the load short-circuiting decreases. When the load short-circuiting is detected, the gate voltage falls below the threshold voltage $V_{TH2}$, but the threshold voltage $V_{TH2}$ is more than $V_{TH1}$, so that the first IGBT and the sensor IGBT do not open and are in a current limit state. Thus, when the load is short-circuited, stepping down of the current value as the current is cut off when the second IGBT opens and current limiting of the first IGBT and the sensor IGBT function, so that the overcurrent at the load short-circuiting time can be prevented effectively and the destruction resistance amount to load short-circuiting can be increased. Particularly, if there are variations in manufacturing the current limiting circuit, etc., the discrete current step-down width absorbs the variations, so that they are hard to become manifest as variations in limit current values. Therefore, variations in destruction resistance amounts to load short-circuiting can be very lessened.

In the second means, when load short-circuiting is detected and the second IGBT is opened, charge (or discharge) to the gate capacity of the second IGBT is suppressed by the gate resistor and the gate capacity of the sensor IGBT is instantaneously separated and the gate capacity of the second IGBT is discharged (or charged) concentratedly. Thus, the gate capacity of the second IGBT can be fast discharged (fast charged), so that the turn-off time of the second IGBT is shortened and the step-down effect for current limit is speeded up.

If the threshold voltage $V_{TH2}$ of the second IGBT is set low on the order of 1 V as compared with the threshold voltage $V_{TH1}$ of the first IGBT, the on voltage of the second IGBT decreases, so that the loss can be lessened and the mutual conductance of the first IGBT having a high threshold voltage lessens. Thus, when the load is short-circuited, the current limit activity becomes furthermore active and the destruction resistance amount to load short-circuiting can also be increased.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the invention with reference to the accompanying drawings.

First Embodiment

Figure 1:
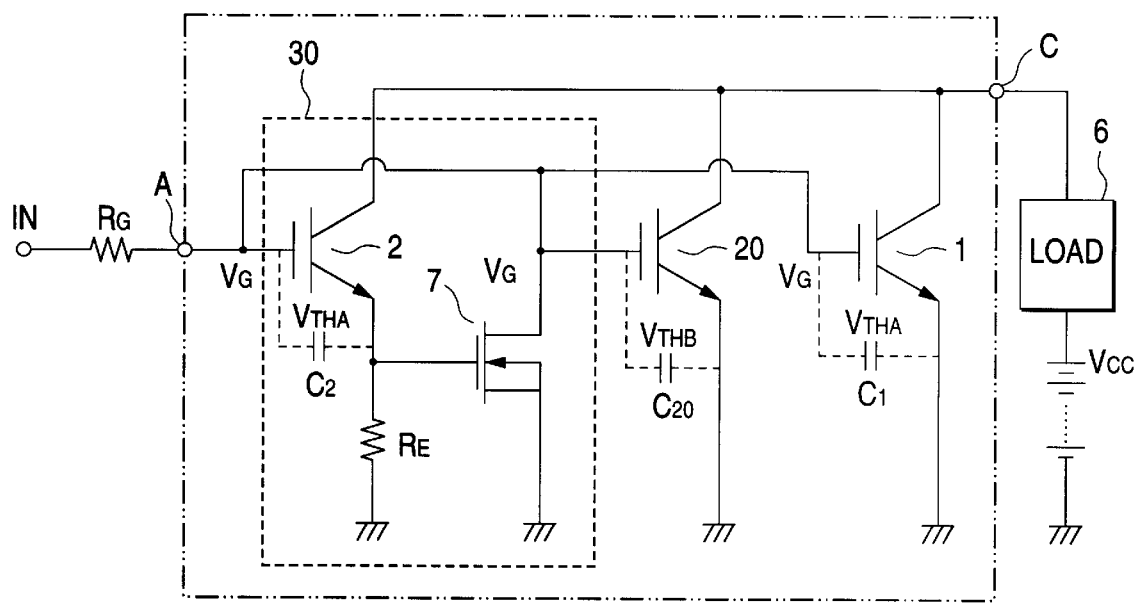
FIG. 1 is a circuit diagram to show a first embodiment of an insulated gate bipolar transistor device comprising a current limiting circuit according to the invention.

FIG. 1 is a circuit diagram to show a first embodiment of an insulated gate bipolar transistor device comprising a current limiting circuit according to the invention. The insulated gate bipolar transistor (IGBT) device comprising a current limiting circuit of the embodiment is a semiconductor device comprising a main IGBT 1, a sub IGBT 20, and a current limiting circuit 30 on one chip. That is, the semiconductor device has an n-channel main IGBT 1 whose current is controlled by a gate signal IN input via an external gate resistor RG to a gate terminal A, an n-channel sub IGBT 20 whose current is controlled by the gate signal IN, the sub IGBT 20 being connected in parallel with the main IGBT 1, an n-channel sensor IGBT 2 whose current is controlled by the gate signal IN, the sensor IGBT 2 being connected in parallel with the main IGBT 1, an emitter resistor RE for detecting an overcurrent caused by load short-circuiting, etc., with a collector current flowing into the sensor IGBT 2, and an n-channel MOSFET 7 to which a voltage drop of the emitter resistor RE is applied as a gate voltage for fast discharging gate capacities C1, C2, and C20 of the IGBT 1, IGBT 2, and IGBT 20. In the embodiment, threshold voltage VTHB of the sub IGBT 20 is set high as compared with threshold voltage VTHA of the main IGBT 1 and the sensor IGBT 2. Setting the threshold voltage high means that there is a difference of the order of 1 V far larger than the threshold voltage error range of within 0.3 V by a normal process. For example, VTHB is set to 8 V and VTHA is set to 4 V. VCC power supply is connected via a load 6 to a collector terminal C.

When the gate signal IN rises, the gate capacities G1, C20, and C2 of the IGBT 1, the IGBT 20, and the IGBT 2 are charged and the gate voltage VG exceeds the threshold voltage VTHB, thus the IGBTs are turned on. Since the element scale of the sensor IGBT 2 is far small as compared with that of the IGBT 1, IGBT 20, the gate capacity of the sensor IGBT 2 can be ignored. When the sensor IGBT 2 is turned on, its collector current flows into the emitter resistor RE and its voltage drop is applied as the gate voltage of the MOSFET 7. However, since the amount of the collector current of the sensor IGBT 2 is far minute &a compared that of the IGBT 1, IGBT 20, the voltage drop value is less than the threshold value of the MOSFET 7 and the MOSFET 7 remains open. Next, when the gate signal IN falls, the gate capacities G1, C20, and C2 of the IGBT 1, the IGBT 20, and the IGBT 2 are discharged and the gate voltage VG falls below the threshold voltage VTHA, thus the IGBTs are turned off.

Figure 2:
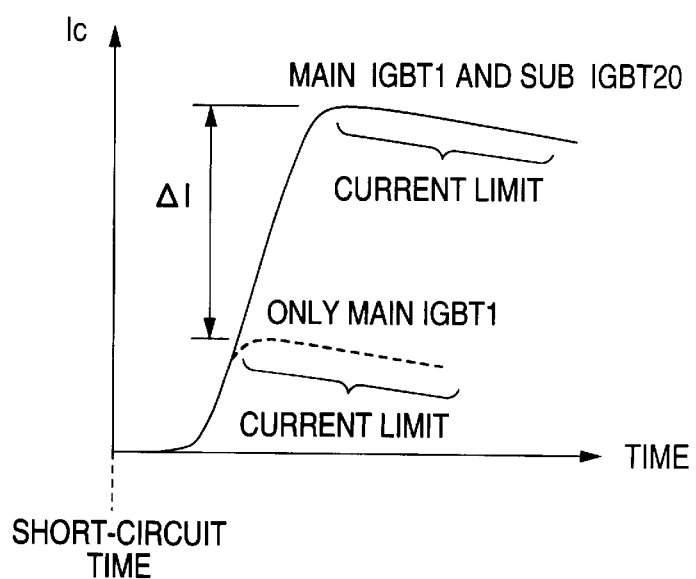
FIG. 2 is a waveform chart to show change of time and IGBT collector current IC from the short-circuiting time to explain the operation of the first embodiment.

When the IGBT 1, the IGBT 20, and the IGBT 2 are on, if the load 6 is short-circuited, a large current also starts to flow into the sensor IGBT 2, the voltage drop of the emitter resistor RE abruptly increases, and the drain current of the n-channel MOSFET 7 increases. Thus, the gate capacities C1, C20, and C2 are discharged dominantly against feed of high level voltage of the gate signal IN, so that the gate voltage VG abruptly decreases and falls below the threshold voltage VTHB. Resultantly, only the sub IGBT 20 opens and the overcurrent caused by load short-circuiting decreases. When the load short-circuiting is detected, the gate voltage VG falls below the threshold voltage VTHB, but is more than the threshold voltage VTHA, so that the main IGBT 1 (also containing the sensor IGBT 2) does not open and is in a current limit state, as shown by the broken line in FIG. 2. Thus, when the load is short-circuited, stepping down of the current value as the current is cut off when the sub IGBT 2 opens and current limiting of the main IGBT function, so that the overcurrent at the load short-circuiting time can be prevented effectively and the destruction resistance amount to load short-circuiting can be increased.

When the load is short-circuited, the IGBTs perform the analog current limit operation and in addition, the sub IGBT 20 in parallel with the main IGBT 1 cuts off. Thus, the load short-circuit current can be drastically stepped down. This step-down width I is determined by the ratio of the element area of the sensor IGBT 2 to the element area of the main IGBT 1. If there are resistance value variations of the emitter resistor RE, characteristic variations of the gate voltage control MOSFET 3, etc., the discrete step-down width I absorbs the variations, so that they are hard to become manifest as variations in limit current values. Therefore, variations in destruction resistance amounts to load short-circuiting can be very lessened.

Second Embodiment

Figure 3:
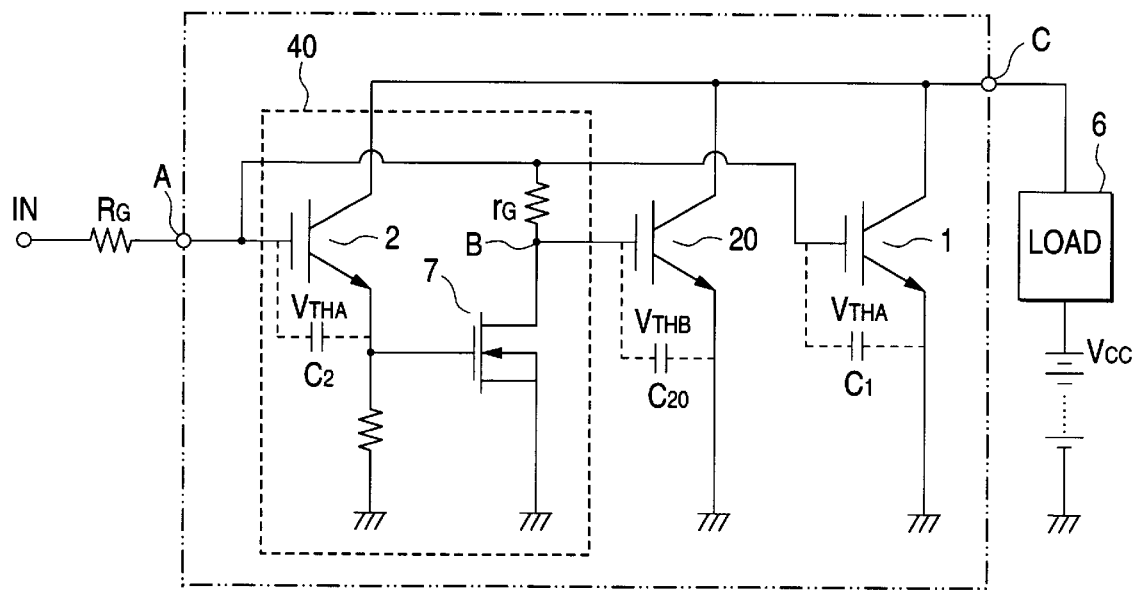
FIG. 3 is a circuit diagram to show a second embodiment of an insulated gate bipolar transistor device comprising a current limiting circuit according to the invention.

FIG. 3 is a circuit diagram to show a second embodiment of an insulated gate bipolar transistor device comprising a current limiting circuit according to the invention. The circuit of the embodiment is provided by inserting a gate resistor rG for limiting discharge between input terminal A and sub IGBT 20 and gate terminal B in the circuit shown in FIG. 1.

In the circuit in FIG. 1, when load short-circuiting is detected, the gate capacities C1, C20, and C2 of the IGBT 1, the IGBT 20, and the IGBT 2 are discharged according to the drain current of the MOSFET 3 and on the other hand, power is fed into the gate capacities C1, C20, and C2 of the IGBT 1, the IGBT 20, and the IGBT 2 according to the high level voltage of the gate signal IN. Thus, the gate voltage VG falls below the threshold voltage VTHB slowly and the turn-off time of the sub IGBT 20 is prolonged. Moreover, to prevent the gate voltage VG from falling below the threshold voltage VTHA at the time, it is difficult to set the gate current value flowing in from the gate terminal A, the drain current value of the MOSFET 3, etc., and the operation area flexibility lessesns. Generally, if the threshold voltage of the IGBT is raised, the on voltage (saturation collector voltage) VCE (sat) is raised and the power loss increases. Thus, if the threshold voltage VTHB of the sub IGBT 20 is set higher than the threshold voltage VTHA, the on voltage of the sub IGBT 20 is raised.

However, in the second embodiment, when load short-circuiting is detected and a sub IGBT 20 is opened, charge from a gate terminal A to a gate capacity C20 of the sub IGBT 20 is suppressed by a gate resistor rG and a gate capacity C1 of an IGST 1 is instantaneously separated and the gate capacity C20 is discharged concentratedly. Thus, the gate capacity C20 can be fast discharged, so that the turn-off time of the sub IGBT 20 is shortened and the step-down effect for current limit is speeded up. Particularly, a MOSFET 7 need not be set in an operation area as a current limit element and may be operated as a switching element, thus the effects of resistance value variations of an emitter resistor RE and characteristic variations of the MOSFET 7 are eliminated.

Figure 4:
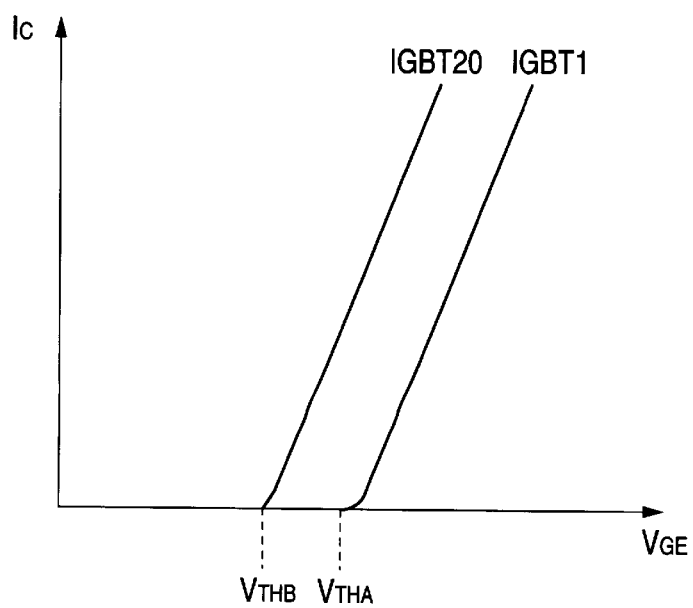
FIG. 4 is a graph to show the relationship between emitter-to-gate voltage and collector current IC of a main IGBT and a sub IGBT in the second embodiment of the invention.
Figure 5:
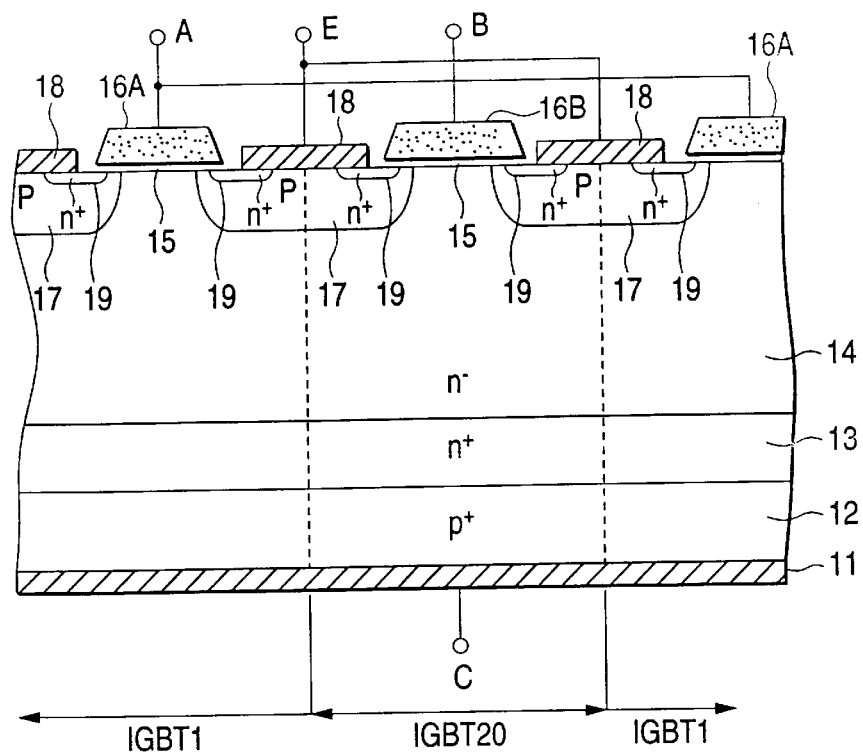
FIG. 5 is a sectional view to show a semiconductor structure used with the second embodiment of the invention.
Figure 6:
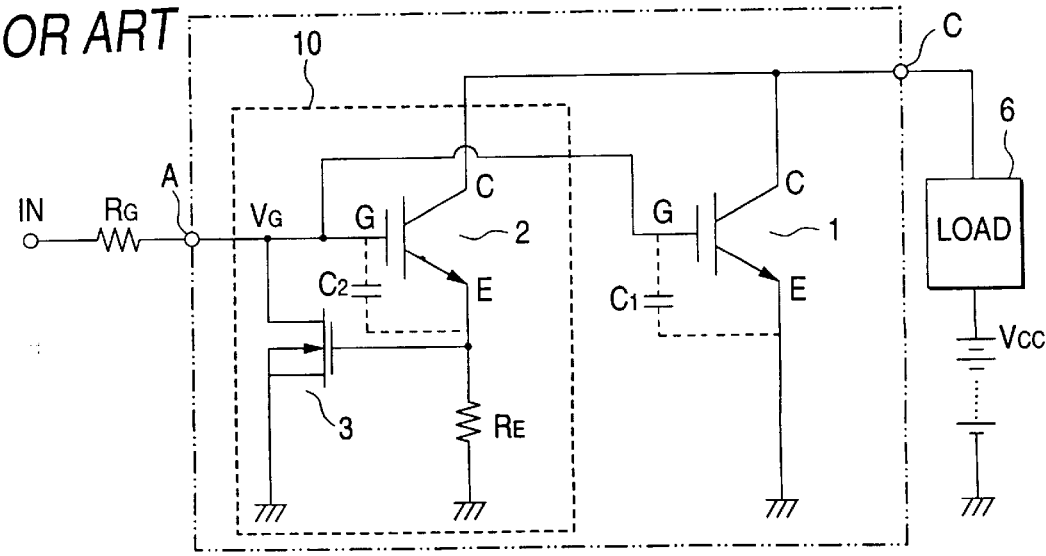
FIG. 6 is a circuit diagram to show a conventional insulated gate bipolar transistor comprising a current limiting circuit.
Figure 7:
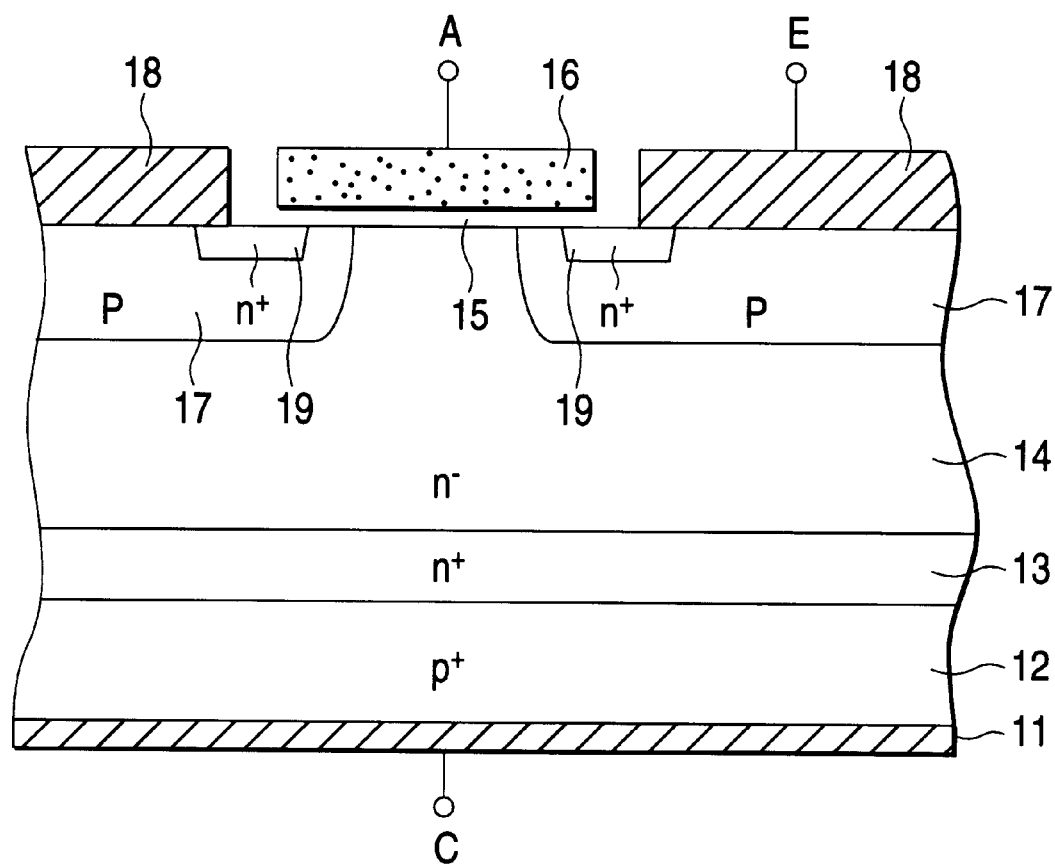
FIG. 7 is a sectional view to show a conventional general IGBT structure.
Figure 8A:
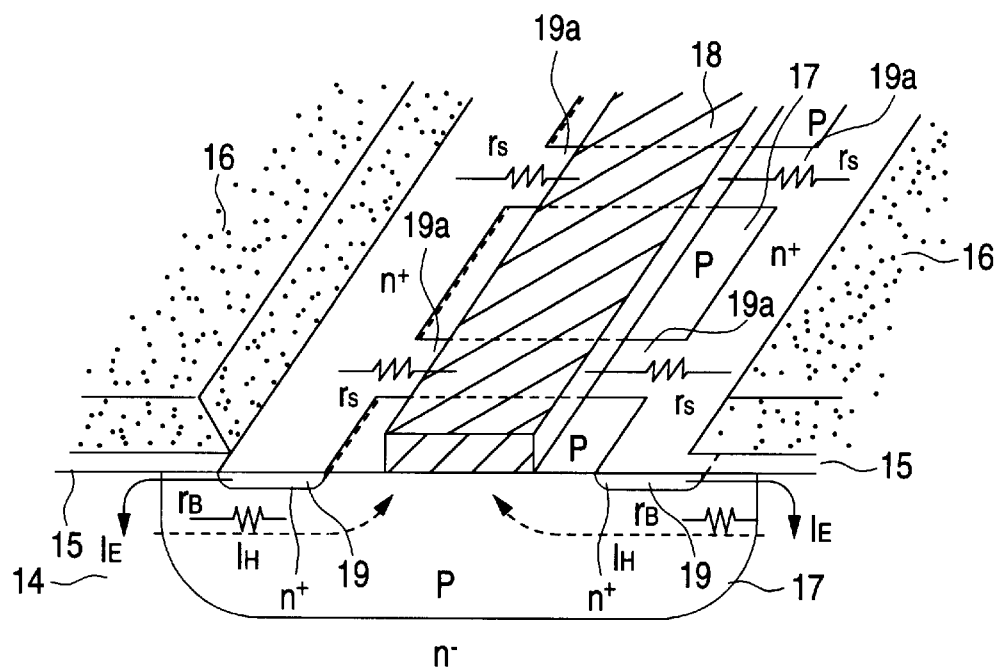
FIGS. 8A and 8B are partially perspective views to show conventional structures of IGBTs different from the IGBT in FIG. 7.
Figure 8B:
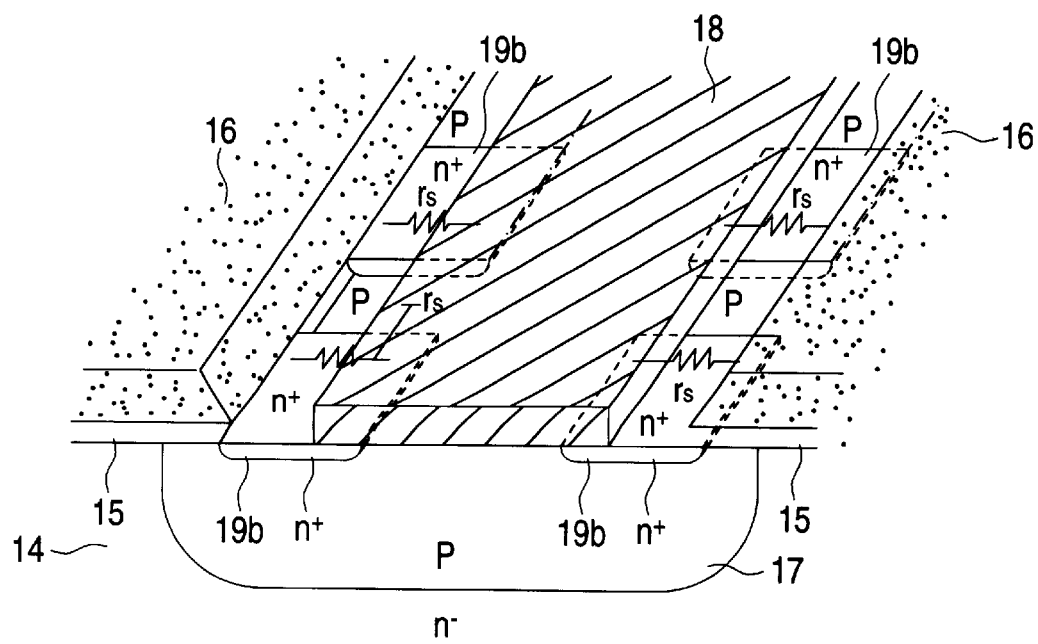

Threshold voltage VTHB of the sub IGBT 20 need not be set higher than threshold voltage VTHA of a main IGBT 1 and may be set as desired. If the threshold voltage VTHB of the sub IGBT 20 is set lower than the threshold voltage VTHA of the main IGBT 1, as shown in FIG. 4, the on voltage of the sub IGBT 20 decreases, so that the loss can be lessened. At the same time, if the threshold voltage of IGBT is raised, mutual conductance g=IC/VGE lessens and collector current IC becomes hard to flow. Thus, when a load is short-circuited, the current limit activity of the main IGBT 1 having a high threshold voltage becomes furthermore active, so that the destruction resistance amount to load short-circuiting can also be increased.

The one-chip semiconductor device with the threshold voltage VTHB of the sub IGBT 20 lower than the threshold voltage VTHA of the main IGBT 1 has a p$^+$-type collector layer (minority carrier injection layer) 12 covered with a collector electrode 11 on the rear face, an n$^+$-type buffer layer 13 laminated on the collector layer 12, an n$^-$-type conductivity modulation layer 14 formed on the buffer layer 13 by epitaxial growth, polysilicon gate electrodes 16A and 16B formed on the surface of the conductivity modulation layer 14 via a gate insulating film 15, p-type base layers 17 formed like wells on the surface of the conductivity modulation layer 14 by a self-alignment technique with the gate electrodes 16A and 16B as a mask, n$^+$-type source layers 19, and aluminum emitter electrodes 18 formed on the base layers 17. Particularly in the embodiment, the dose amount of the p-type base layer 17 varies at the left and right of the well end; the threshold voltage VTHA of the main IGBT 1 made of the gate electrode 16A is set lower on the order of 1 V than the threshold voltage VTHB of the sub IGBT 20 made of the gate electrode 16B. In addition to changing the dose amount of the p-type base layer, the film thickness of the gate insulting film may be changed as means for making the threshold voltages different.

In the embodiments, the IGBTs are of n-channel type, but p-channel IGBTs may be adopted.

As we have discussed, the invention is characterized by the fact that when an overcurrent at the load short-circuiting time, etc., is detected, the collector current flowing into the first IGBT and the sensor IGBT is limited and the second IGBT is cut off. Therefore, it produces the following effects:

(1) Since stepping down of the current value as the current is cut off when the second IGBT opens and current limiting of the first IGBT and the sensor IGBT function, the overcurrent at the load short-circuiting time can be prevented effectively and the destruction resistance amount to load short-circuiting can be increased. Particularly, if there are variations in manufacturing the current limiting circuit, etc., the discrete current step-down width absorbs the variations, so that they are hard to become manifest as variations in limit current valued. Therefore, variations in destruction resistance amounts to load short-circuiting can be very lessened.

(2) When load short-circuiting is detected and the second IGBT is opened, charge (or discharge) to the gate capacity of the second IGBT is suppressed by the gate resistor and the gate capacity of the sensor IGBT is instantaneously separated and the gate capacity of the second IGBT is discharged (or charged) concentratedly. Thus, the gate capacity of the second IGBT can be fast discharged (fast charged), so that the turn-off time of the second IGBT is shortened and the step-down effect for current limit is speeded up.

(3) If the threshold voltage $V_{TH2}$ of the second IGBT is set low on the order of 1 V as compared with the threshold voltage $V_{TH1}$ of the first IGBT, the on voltage of the second IGBT decreases, so that the loss can be lessened. At the same time, the mutual conductance of the first IGBT having a high threshold voltage lessens. Thus, when the load is short-circuited, the current limit activity becomes furthermore active and the destruction resistance amount to load short-circuiting can also be increased.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulated gate bipolar transistor device, comprising:
   a current limiting circuit having a sensor insulated gate bipolar transistor of a first conduction type whose current is controlled by a gate voltage of a gate terminal;
   a first insulated gate bipolar transistor of the first conduction type whose current is controlled by the gate voltage;
   a second insulated gate bipolar transistor of the first conduction type whose current is controlled by the gate voltage, said second insulated gate bipolar transistor being electrically connected in parallel with said first insulated gate bipolar transistor;
   current-voltage conversion means for converting an increase or decrease in a collector current of said sensor insulated gate bipolar transistor into an increase or decrease in a conversion voltage, wherein a series combination of said sensor insulated gate bipolar transistor and said conversion means is electrically connected in parallel with said first insulated gate bipolar transistor; and
   active means whose current is controlled based on the conversion voltage for discharging a gate capacity attendant on the gate terminal
   wherein a threshold voltage $V_{TH2}$ of said second insulated gate bipolar transistor is set on the order of approximately 1 V higher as compared with a threshold voltage $V_{TH1}$ of said first insulated gate bipolar transistor.

2. An insulated gate bipolar transistor device, comprising:
   a current limiting circuit having a sensor insulated gate bipolar transistor of a first conduction type whose current is controlled by a gate voltage of a gate terminal;
   a first insulated gate bipolar transistor of the first conduction type whose current is controlled by the gate voltage;
   a second insulated gate bipolar transistor of the first conduction type having a gate connected via a gate resistor to the gate terminal, said second insulated gate bipolar transistor being electrically connected in parallel with said first insulated gate bipolar transistor, wherein the collector terminals of said second insulated gate bipolar transistor and said first insulated gate bipolar transistor are commonly connected to each other and the emitter terminals of said second insulated gate bipolar transistor and said first insulated gate bipolar transistor are commonly connected to each other;
   current-voltage conversion means for converting an increase or decrease in a collector current of said sensor insulated gate bipolar transistor into an increase or decrease in a conversion voltage, wherein a series combination of said sensor insulated gate bipolar transistor and said conversion means is electrically connected in parallel with said first insulated gate bipolar transistor, and active means whose current is controlled based on the conversion voltage for discharging a gate capacity attendant on the gate of the second insulated gate bipolar transistor.

3. The insulated gate bipolar transistor device as claimed in claim 2 wherein a threshold voltage $V_{TH2}$ of said second insulated gate bipolar transistor is set on the order of approximately 1 V lower as compared with a threshold voltage $V_{TH1}$ of said first insulated gate bipolar transistor.

* * * * *